United States Patent

[11] 3,590,163

[72] Inventor Adriaan Charles Karman
Emmasingel, Eindhoven, Netherlands
[21] Appl. No. 845,703
[22] Filed July 29, 1969
[45] Patented June 29, 1971
[73] Assignee U.S. Philips Corporation
New York, N.Y.

[54] BOOTSTRAPPED TRANSISTOR AMPLIFIER CIRCUIT WITH IMPROVED UNDESIRED SIGNAL SUPPRESSION
5 Claims, 1 Drawing Fig.

[52] U.S. Cl. 179/15, 330/156, 328/176
[51] Int. Cl. H04h 5/00
[50] Field of Search 325/486; 328/176; 330/21, 26, 78, 80, 87, 94, 109, 156; 179/15 BT

[56] References Cited

UNITED STATES PATENTS

| | | | |
|---|---|---|---|
| 2,351,934 | 6/1944 | Kramolin | 330/91 |
| 2,240,715 | 5/1941 | Percival | 330/91 |

FOREIGN PATENTS

| | | | |
|---|---|---|---|
| 789,584 | 1/1958 | Great Britain | 330/78 |

*Primary Examiner*—Kathleen H. Claffy
*Assistant Examiner*—Tom D'Amico
*Attorney*—Frank R. Trifari

ABSTRACT: A bootstrapped transistor amplifier circuit in which between the emitter of the transistor and the connection of the bootstrap branch in the emitter lead a parallel resonance circuit is provided for obtaining an attenuation of at least one signal frequency relative to others by a combined action of feedback and input impedance change as function of frequency caused by the resonance circuit.

PATENTED JUN 29 1971
3,590,163
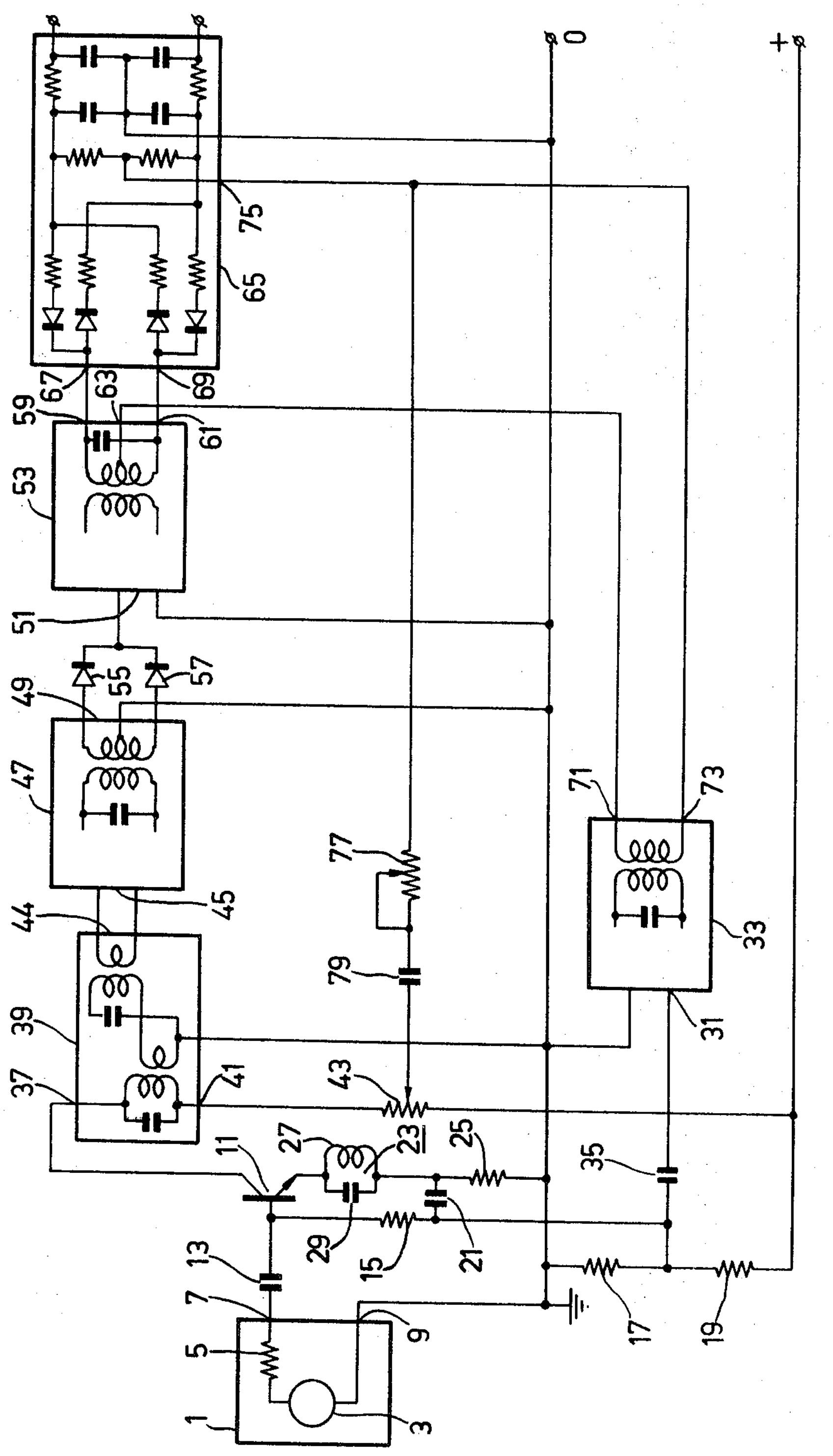
INVENTOR.
ADRIAAN C. KARMAN
BY
[signature]
AGENT

BOOTSTRAPPED TRANSISTOR AMPLIFIER CIRCUIT WITH IMPROVED UNDESIRED SIGNAL SUPPRESSION

The present invention relates to an amplifier circuit and more particularly, but not exclusively, it relates to an amplifier circuit in a stereo decoding circuit connected to the output of a frequency demodulator.

An object of the invention is to provide an improved amplifier circuit with a relatively high input impedance, for the signals to be amplified, which attenuates at least one undesired signal frequency relative to the other desired signal frequencies.

It is an object of the invention to provide such an amplifier circuit in which the relative attenuation of an undesired signal frequency is obtained with simple means and great effect.

Still another object of the invention is to provide an amplifier circuit following a frequency demodulator in a stereo-decoding circuit in which amplifier circuit a relatively high suppression of the S.C.A. signal is obtained with simple means.

According to the present invention in the emitter circuit of a bootstrapped transistor amplifier, between the emitter and the point from which a signal is bootstrapped to the input of the amplifier, a resonance circuit with parallel resonance character is provided this resonance circuit provides a negative feedback at the undesired signal frequency or frequencies at the emitter of the transistor and additionally influences the base input impedance of the transistor via the bootstrap coupling to the base of this transistor. The input impedance decreases in the resonance frequency region of the resonance circuit. The combined effect of feedback and input impedance influencing causes a much stronger suppression of signals of undesired frequencies than can be obtained with a similar resonance circuit as used in a circuit according to the invention connected in an other way with the use of the same amount of circuit components.

These and other objects and advantages of the invention will be illustrated with the aid of the accompanying drawing containing only one figure.

In the FIG. in which details are omitted which are not important for the understanding of the invention, a partly schematic partly block diagram illustrates a stereo FM decoder with an amplifier circuit according to the invention.

In the FIG. a frequency demodulator 1 symbolically presented by a signal voltage source 3 in a series with a resistor 5 representing the internal resistance of the demodulator. The demodulator 1 has two output terminals 7 and 9 between which the series circuit with the voltage source 3 and the resistor 5 delivers a demodulated signal which in the case of demodulation of a stereo signal according to the F.C.C. (French Communication Committee) contains a low frequency sumsignal M of left and right audio signals (L+R), a pilot signal of 19 kc./sec. a subcarrier amplitude modulated by a low frequency difference signal S of said left and right signals (L−R) and a signal of 67 kc./sec. frequency modulated according to the Subsidiary Communication Authorization (S.C.A.) The output terminal 9 of the demodulator 1 is connected to ground (O) and the output terminal 7 is coupled to the base of a npn transistor 11 via a capacitor 13. The base of the transistor 11 is biased via a resistor 15 which at its other side is connected to a tap on a potentiometer circuit formed by resistors 17 and 19 connected between a positive voltage (+) and ground (0).

The other side of the resistor 15 further is connected to the emitter circuit of the transistor 11 via a capacitor 21 which at its other side is connected to a tap on a series circuit of a parallel resonance circuit 23 tuned at 67 kc./sec. and a resistor 25 connected between the emitter of the transistor 11 and ground (O). According to the invention this bootstrapped emitter circuit with the parallel resonance circuit 23 provides a very good suppression of the 67 kc./sec. S.C.A. signal which has to be suppressed in the decoder circuit in order to prevent interference signals in the outputs of the decoder. The function of the circuit will be described further on.

The parallel resonance circuit 23 in this case is formed by a coil 27 shunted by a capacitor 29 but may be composed in a more complicated manner, for instance the circuit 23 may be coupled with one or more further resonance circuits.

The connection between the resistors 15, 17, 19 and the capacitor 21 further is coupled to an input terminal 31 of an amplifier 33 via a capacitor 35. The amplifier 33 is a band-pass amplifier for the modulated S signal band around 38 kc./sec.

The collector of the transistor 11 is connected to a terminal 37 of a 19 kc./sec. filter 39. The terminal 37 is coupled to a terminal 41 of the band-pass filter 39 via a parallel resonance circuit forming part of the filter 39. The terminal 41 of the filter 39 is connected to a positive voltage (+) via a potentiometer 43.

An output 44 of the filter 39 is connected to an input 45 of an amplifier 47. An output 49 of the amplifier 47 is coupled with an input 51 of an amplifier 53 via a frequency doubler circuit with diodes 55 and 57.

An output circuit of the amplifier 53 with terminals 59, 61 and 63 is coupled to an input circuit of a synchronous detector and matrixing unit 65. The terminals 59 and 61 of the amplifier 53 are connected to the terminals 67 and 69 respectively of the unit 65. The output terminal 63 of the amplifier 53 is connected with an output terminal 71 of the modulated S signal amplifier 33. Another output terminal 73 of this amplifier is connected with an input terminal 75 of the unit 65. The input terminal 75 of the synchronous detection and matrixing unit 65 further is connected via an adjustable resistor 77 in series with a capacitor 79 with the slider of the potentiometer 43. Through the last-mentioned connection a monoaudio signal M is fed to a matrixing circuit of the unit 65. This unit 65 further receives the S-signal to be demodulated from the terminals 71 and 73 of the amplifier 33 and a reference carrier for the synchronous demodulation of the modulated S-signal from the terminals 59 and 61 of the amplifier 53.

The functions of the signal chains from the various outputs of the amplifier circuit with the transistor 11 to the demodulation and matrixing unit 6 5 may supposed to be well-known to the man of the art and will not be described in detail.

The function of the amplifier circuit with the transistor 11 according to the invention is as follows. For signals outside the resonance frequency region of the parallel resonance circuit 23 in the emitter lead of the transistor 11 this circuit 23 forms a rather low impedance, The voltage of the emitter of the transistor 11, which is substantially equal to the voltage at the base of this transistor, is then bootstrapped through the resonance circuit 23 and the capacitor 21 to the lower side of the resistor 15. A relatively low signal voltage drop over the resistor 15 then occurs when an input signal is present at the base of the transistor 11. The input impedance of the transistor consequently is relatively high and due to the rather low emitter circuit impedance the negative feedback in the emitter circuit is comparatively low and the amplification of the transistor 11 relatively high. Because the input impedance is rather high compared with the internal resistance 5 of the FM demodulator 1, a great part of the signal voltage delivered by the demodulator 1 appears at the base of the transistor 1. The transistor 1 in this case is excited at its base with a great part of the signal amplitude delivered by the demodulator and in addition provides a relatively high gain.

If the signal obtained from the demodulator 1 is of the resonance frequency of the circuit 23 in the emitter lead, this circuit 23 forms a high impedance. Consequently the voltage drop over the resistor 15 will be relatively great and the relatively heavy load formed by this resistor 15 at the input of the amplifier circuit presents a low impedance, Due to the high impedance in the emitter circuit the feedback of the transistor is high and its amplification low. Due to the low input impedance of the transistor circuit a relatively low part of the signal delivered by the demodulator 1 appears at its base. Consequently in this case the transistor 11 is excited at its base with a relatively low signal and provides a relatively low gain.

The amplifier feedback impedance components herein employed are designed to provide substantially linear feedback over the passband of the amplifier by exhibiting substantially nonreactive or practically ohmic characteristics over the passband.

This combined effect of input impedance change and change of amplification, both caused by its special position, the resonance circuit 23 yields a very good suppression of signals at the resonance frequency compared with signals of other frequencies in the passband of the amplifier circuit. In order to obtain the above described results it is of importance that the value of resistor 15 is of the same order of magnitude or smaller than the internal resistance of the signal source 1. On the other hand the resistor 15 should not be so low that the base-emitter input of the transistor 11 is substantially short-circuited at the desired signal frequencies.

With an internal resistance 5 of the demodulator 1 of about 5 kΩ, a value of the resistors 15, 17, 19 and 25 of respectively about 5, 6 kΩ, 2, 7 kΩ, 10 kΩ and 300 Ω, a value of the capacitors 13 and 21 of respectively about 10 μf. and 100 μf., and a Q of the resonance circuit 23 of about 60 a relative suppression of 35 db. is obtained which is about 6 db. better than with any other arrangement of the same amount of components.

It will be evident that the collector impedance of the transistor 11 in this case will have practically no influence on this relative suppression although of course it is of importance for the gain of the circuit which can be made as good as in comparable known circuits.

What I claim is:

1. An amplifier circuit comprising a first input means coupled to the base of a transistor, this base further being coupled via a first impedance being practically ohmic over the passband of the amplifier circuit to the junction of a resonance filter having a high impedance on at least one signal frequency to be relatively attenuated in the pass-band of the amplifier circuit, a second impedance being practically ohmic over the passband of the amplifier circuit, having one terminal coupled to said junction, the emitter of the transistor being coupled to a terminal of the resonance filter remote from the said junction, a terminal of the second impedance remote from the said junction being coupled to a second input means, said first and second input means forming an input of the amplifier circuit.

2. An amplifier circuit comprising a first input terminal connected to the base of a transistor, a first terminal of a parallel resonance circuit being connected to the emitter of the said transistor, a second terminal of the resonance circuit being connected to a second input terminal via a first resistor, the base of the transistor further being connected to the said second terminal of the parallel resonance circuit via a series circuit of a second resistor and a capacitor.

3. An amplifier circuit as claimed in claim 2 in which a first terminal of the second resistor is connected to the base of the transistor and a second terminal of the second resistor is connected to a biasing circuit, the capacitor being connected between the junction of the second terminal of the second resistor with the biasing circuit and the junction of the parallel resonance circuit with the first resistor.

4. An amplifier circuit in a frequency modulation stereo-decoding circuit which frequency demodulation stereo-decoding circuit comprises a frequency demodulator with a first output terminal being coupled with the base of a transistor and a second output terminal being coupled to ground, the emitter of the said transistor being coupled to ground via a series circuit of respectively a parallel resonance S.C.A. filter and a first practically ohmic impedance, the base of said transistor further being coupled to a tap on said series circuit via a second practically ohmic impedance.

5. An amplifier circuit in a frequency demodulation stereo-decoding circuit as claimed in claim 4, the amplifier circuit having first output means coupled to the first impedance and second and third output means coupled to a collector circuit of the said transistor, said first output means being coupled to a stereo-modulated-subcarrier-amplifier input, said second output means being coupled to a stereo-subcarrier-regenerator input and the said third output means being coupled to a matrixing circuit input.